United States Patent [19]
Kadosh et al.

[11] Patent Number: 5,949,092
[45] Date of Patent: Sep. 7, 1999

[54] ULTRA-HIGH-DENSITY PASS GATE USING DUAL STACKED TRANSISTORS HAVING A GATE STRUCTURE WITH PLANARIZED UPPER SURFACE IN RELATION TO INTERLAYER INSULATOR

[75] Inventors: Daniel Kadosh, Austin; Mark I. Gardner, Cedar Creek; Michael Duane, Austin, all of Tex.

[73] Assignee: Advanced Micro Devices, Inc., Sunnyvale, Calif.

[21] Appl. No.: 08/905,486

[22] Filed: Aug. 1, 1997

[51] Int. Cl.$^6$ .................................................. H01L 29/78
[52] U.S. Cl. ........................ 257/67; 257/241; 257/330; 257/332; 257/368; 257/377; 257/385; 438/153; 438/158
[58] Field of Search .............................. 257/67, 70, 241, 257/250, 266, 288, 330–332, 368, 369, 401, 377, 388, 520; 438/153, 158

[56] References Cited

U.S. PATENT DOCUMENTS

| | | |
|---|---|---|
| 4,654,121 | 3/1987 | Miller et al. ................................. 29/571 |
| 4,686,758 | 8/1987 | Liu et al. ..................................... 257/67 |
| 4,916,507 | 4/1990 | Boudou et al. . |
| 4,939,568 | 7/1990 | Kato et al. . |
| 5,128,745 | 7/1992 | Takasu et al. . |
| 5,391,894 | 2/1995 | Itabashi et al. . |
| 5,426,072 | 6/1995 | Finnila . |
| 5,612,552 | 3/1997 | Owens . |
| 5,661,325 | 8/1997 | Hayashi et al. . |
| 5,751,050 | 5/1998 | Ishikawa et al. . |

FOREIGN PATENT DOCUMENTS

| | | |
|---|---|---|
| 58-43554 | 3/1983 | Japan . |
| 62-145850 | 6/1987 | Japan . |
| 63-211672 | 9/1988 | Japan . |
| 2-109359 | 4/1990 | Japan . |
| 4-360570 | 12/1992 | Japan . |

*Primary Examiner*—Fetsum Abraham
*Attorney, Agent, or Firm*—Skjerven, Morrill, MacPherson, Franklin & Friel LLP; Ken J. Koestner

[57] ABSTRACT

A multi-dimensional transistor structure is fabricated which includes a base transistor substrate upon which transistors are formed. An elevated substrate is formed overlying the base transistor and having an oxide isolation formed in localized regions beneath the elevated substrate but overlying the base transistor substrate. A plurality of transistors are formed on a substrate wafer to form a base-level transistor formation. An intralevel dielectric (ILD) layer is deposited overlying the base-level transistor formation. Overlying the ILD layer, a "sandwich" structure is formed with the deposition of a first polysilicon layer, deposition of an oxide isolation layer, and deposition of a second polysilicon layer. The median oxide isolation layer is patterned and etched according to a localized oxide isolation mask in a configuration determined by the position of transistors in the base-level transistor formation and by the planned position of transistors, that are not yet formed, in an overlying elevated substrate level. The median oxide isolation layer is patterned and etched in a configuration so that isolation is achieved in a predetermined manner, for example, on an individual transistor basis, a transistor group basis, or the like. The resulting electronic integrated circuit structure is used for high speed circuit applications due to high packing densities and small distances between devices.

29 Claims, 6 Drawing Sheets

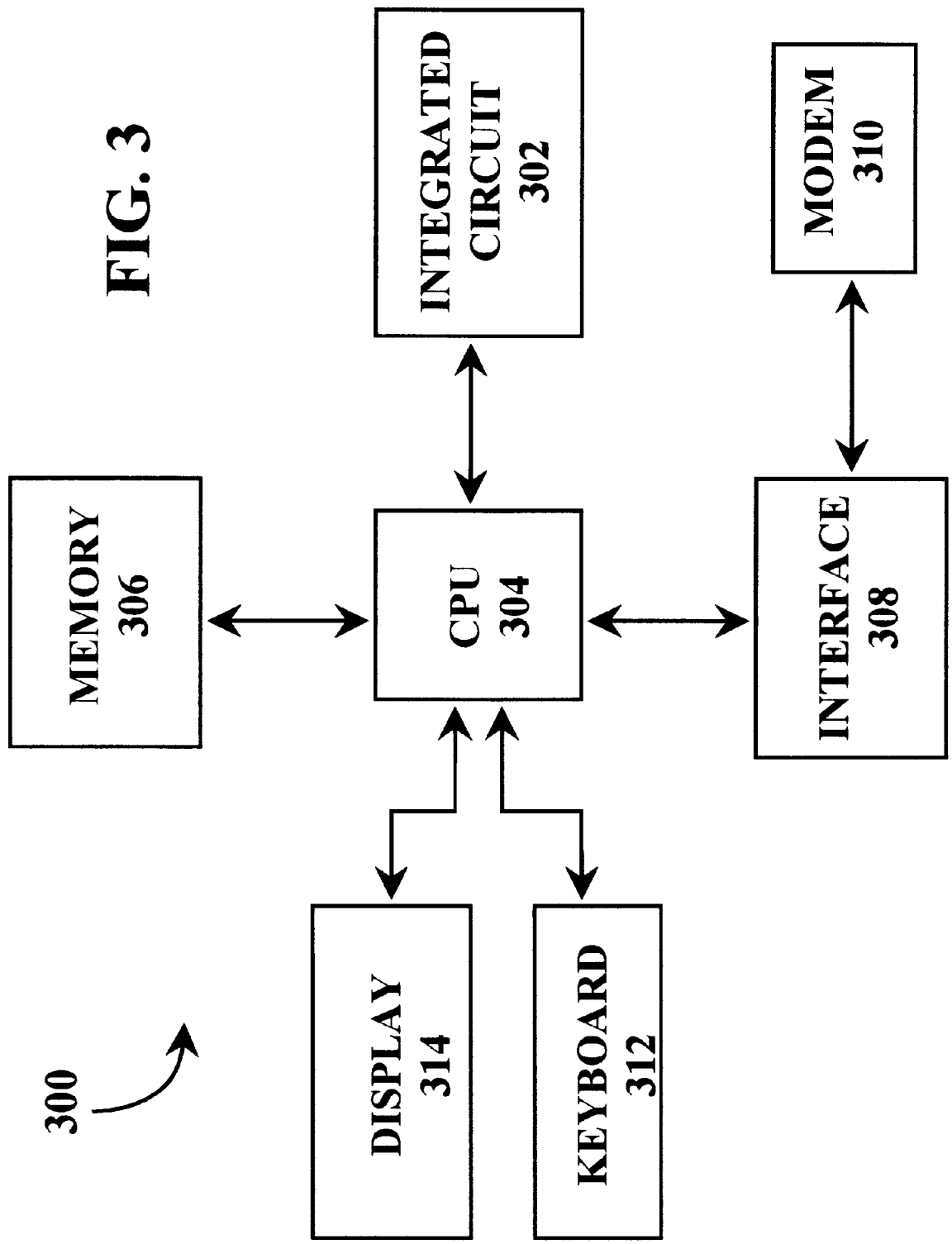

5,949,092

ULTRA-HIGH-DENSITY PASS GATE USING DUAL STACKED TRANSISTORS HAVING A GATE STRUCTURE WITH PLANARIZED UPPER SURFACE IN RELATION TO INTERLAYER INSULATOR

BACKGROUND OF THE INVENTION

1. Field of the Invention

The present invention relates to an integrated circuit structure and fabrication method thereof. More specifically, the present invention relates to an integrated circuit including a pass-gate constructed using transistors that are stacked perpendicular to a substrate surface.

2. Description of the Related Art

The primary goal of integrated circuit fabrication is the production of circuits having the highest performance at the lowest cost. The main performance criteria for MOS integrated circuits are speed, power dissipation, and device packing density. The goals of improving performance and reducing cost have been mainly achieved through reductions in device size. Smaller devices advantageously decrease semiconductor die size so that more chips are produced per wafer and a lower percentage of the chips on a wafer are unusable, thus reducing the die cost.

Accordingly, the semiconductor industry has focused on reducing device size for generating technological advancements. However, the reduction in device size alone, without considering other processing parameters may adversely affect integrated circuit performance. For example, power dissipation may degrade because of an increase in device leakage currents or circuit speed may degrade when device sizes are reduced. Reliability problems affecting submicron MOSFETs may also be exacerbated, resulting in hot-carrier degradation, wearing of gate oxide, and electromigration.

What is needed is sophisticated design techniques and design structures that reduce device sizes while maintaining electrical behavior comparable to the behavior of previous generations of larger devices.

SUMMARY

An ultra-high-density pass-gate using dual stacked transistors achieves a reduction in circuit area by approximately one-half while maintaining intact the delivered drive current.

An ultra high density pass-gate uses dual stacked transistors sharing a common gate electrode. The gate electrode, when activated, switches both an upper transistor and a lower transistor of the dual stacked transistors.

In some embodiments, the dual stacked transistors include a lower MOSFET that is similar to conventional MOSFETs, a common gate electrode extending from the gate of the lower electrode to a source-drain and channel segment of an upper MOSFET.

In some embodiments, the dual stack transistors include a MOSFET formed on a substrate and having a gate electrode that is extended through a dielectric layer to an elevated MOSFET including a silicon channel with implanted source and drain segments. The extended gate electrode may be polysilicon or a metal gate. The channel of the MOSFET formed on the substrate is separated from the extended gate electrode by a first gate oxide layer. The extended gate electrode is separated from the channel of the elevated MOSFET by a second gate oxide layer. The first and second oxide layers may be formed to various thicknesses and various relative thicknesses to control performance of the pass-gate.

In accordance with one aspect of the present invention, an ultra-high-density pass-gate using dual stacked transistors includes two N-channel MOS transistors that share a common gate electrode. The common gate electrode is typically polysilicon but may be a metal gate in some embodiments. Each of the two N-channel MOS transistors has a channel region that is separated from the common gate electrode by a gate oxide layer. The absolute thickness and the relative thicknesses of the gate oxide layers are controlled to determine the performance of the pass-gate. The sources of the two N-channel MOS transistors are electrically connected and the drains of the two N-channel MOS transistors are electrically connected. In some embodiments, the connections between the source regions and the connections between the drain regions are made by metal plugs that are silicided at the sources and drains to improve electrical contact.

In accordance with an embodiment of the present invention, an integrated circuit includes dual stacked transistors that share a common gate electrode, and vias interconnecting regions of a first transistor of the dual stacked transistors and a second transistor of the dual stacked transistors.

In accordance with an embodiment of the present invention, a method of fabricating a high density pass gate includes forming a first transistor on a substrate, isolating the first transistor with a dielectric layer on the substrate overlying the transistor, forming a second transistor on the dielectric layer, forming a common gate electrode between the first and second transistors, and isolating the second transistor with a dielectric layer. The method further includes contact etching the dielectric layers between the first and second transistors and forming connections between source and drain regions of the first and second transistors. The connections between source and drain regions are made by deposition of metal plugs such as titanium, tungsten, or tungsten silicon plugs and chemical-mechanical polishing of the plugs. Connections between the source and drain regions of the first and second transistors and external terminals, and connections between the common gate electrode and an external terminal are similarly made by the plugs. In some embodiments, the sources of the first and second transistors are connected and the drains of the first and second transistors are connected to form a pass-gate structure. In some embodiments, the first and second transistors are N-channel MOS transistors.

In accordance with one aspect of the present invention, dual stacked transistors share a common gate. The common gate is typically polysilicon, but in some embodiments may be a metal such as titanium, cobalt, or aluminum.

Many advantages are gained by the described integrated circuit and corresponding fabrication method. The described dual stacked transistors advantageously consumes roughly half the area of a conventional single-level device while delivering the same drive current. The described integrated circuit and fabrication method produces a unique and advantageous transistor structure in the upper transistor of the dual stacked transistors. The concentration of the doping of the source and drain regions of the upper transistor is naturally reduced distal to the top surface of the polysilicon, advantageously producing a natural lightly-doped drain effect within the channel.

BRIEF DESCRIPTION OF THE DRAWINGS

The features of the described embodiments believed to be novel are specifically set forth in the appended claims.

However, embodiments of the invention relating to both structure and method of operation, may best be understood by referring to the following description and accompanying drawings.

FIG. 3 is a schematic block diagram illustrating a computer system including an integrated circuit including transistors formed in a plurality of planes on substrates including an oxide-isolated substrate and a silicon substrate fabricated using a method depicted in FIGS. 1A through 1B, and FIGS. 2A through 2M.

DETAILED DESCRIPTION OF THE ILLUSTRATIVE EMBODIMENTS

Figure 1A:
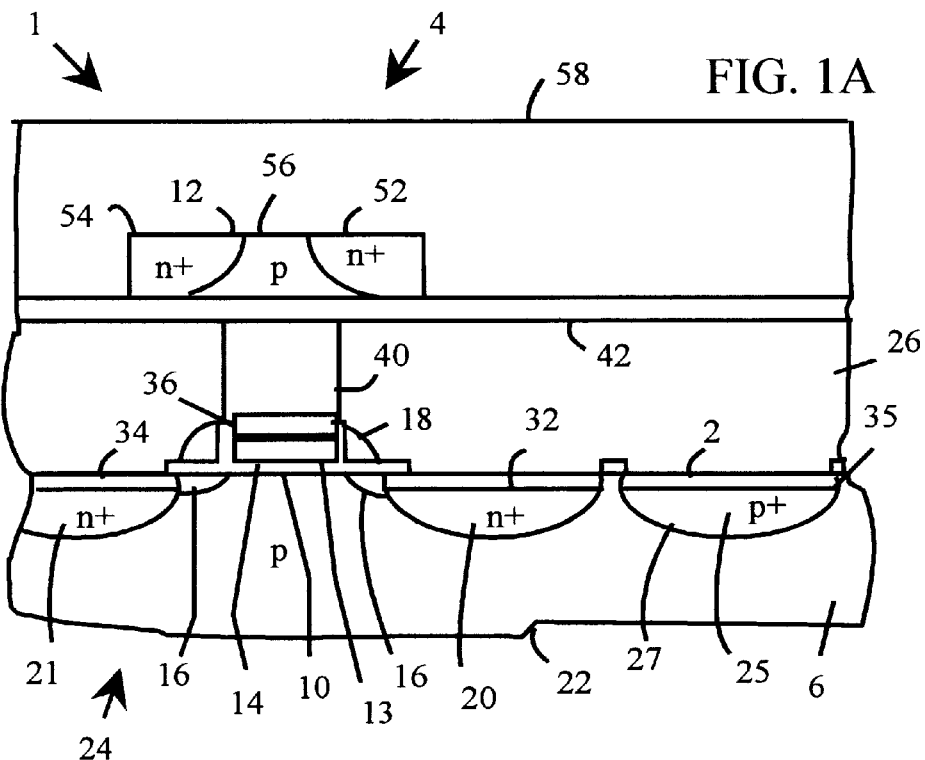
FIGS. 1A and 1B show schematic cross-sectional views of a portion of a semiconductor wafer including high-density pass-gate including two stacked N-channel transistors and which share a common gate electrode in accordance with an aspect of the present invention.

FIG. 1A depicts a portion of a semiconductor wafer 1 showing a cross-sectional view of a high-density pass-gate 4 including two stacked N-channel transistors 10 and 12 which share a common gate electrode 40. The two stacked N-channel transistors 10 and 12 include a lower N-channel MOSFET 10 and an upper N-channel MOSFET 12. The lower N-channel MOSFET 10 is formed on a substrate 6 at a surface 2 of the semiconductor wafer 1. In the illustrative embodiment, the lower N-channel MOSFET 10 is formed using lightly-doped drain (LDD) and salicide-gate MOS fabrication techniques including formation of a first gate oxide layer 13 overlying the substrate 6, formation of a polysilicon gate 14, and lightly-diffused implanting of N– type LDD regions 16 in the substrate 6 self-aligned with the polysilicon gate 14. A layer of silicon dioxide (not shown) is deposited and anisotropically etched to form spacers 18 lateral to the polysilicon gate 14. In the illustrative embodiment, the gate 14 is formed of polysilicon which is deposited by low pressure chemical vapor deposition (LPCVD). In other embodiments, to achieve fast data communications the gate electrodes may be constructed from other materials such as metal. Alternatively, the polysilicon could also be deposited as a sputtered film.

The spacers 18 act as ion implantation masks for subsequent heavier doping of the source and drain. Following formation of the spacers 18, a heavily-doped N+ type drain implant 20 is implanted in a drain region 22 lateral to the lower N-channel MOSFET 10. A source region 24 lateral to the lower N-channel MOSFET 10 and opposite the polysilicon gate 14 from the drain region 22 is implanted with a heavily-doped N+ type source implant 21. A mask (not shown) is formed over the surface 2 of the substrate 6 and patterned to expose a region lateral to the source-drain region (22 and 24) for forming a ground well 25. The ground well 25 is heavily-doped with a P+ type ground implant 27. After ion implantation of the source 21, drain 20, and ground 27 implants, a refractory metal such as titanium (Ti), Tungsten (W), tantalum (Ta), or molybdenum (Mo) is deposited on the surface 2 of the substrate 6 and over the polysilicon gate 14, and silicide is formed by reaction of the refractory metal with polysilicon by an alloy step. Metal silicide is formed in a drain silicide layer 32 at the surface of the drain region 22, in a source suicide layer 34 at the surface of the source region 24, and in a ground silicide layer 35 at the surface of the ground well 25. Metal silicide is also formed in a gate silicide layer 36 at the surface of the polysilicon gate 14. Unreacted metal (not shown) is removed from the surface 2 of the semiconductor wafer 1.

An intralayer dielectric (ILD) layer of silicon dioxide 26 is deposited over the substrate 6 and the polysilicon gate 14 and spacers 18 to electrically isolate devices formed on the substrate 6. The ILD layer of silicon dioxide 26 is deposited in a thick layer and planarized by chemical-mechanical polishing (CNW) or reflow. The ILD layer of silicon dioxide 26 mutually isolates devices on the surface of the substrate 6 and isolates the devices from overlying conductive layers that are subsequently formed.

The ILD layer of silicon dioxide 26 is etched in the region overlying the polysilicon gate 14 and the etched region is filled with polysilicon to form a common gate 40. The polysilicon common gate 40 is planarized to the surface of the ILD layer of silicon dioxide 26, typically by polishing (CMP). A second gate oxide layer 42 is deposited overlying the ILD layer of silicon dioxide 26 and the common gate 40. The thickness of the second gate oxide layer 42 relative to the thickness of the first gate oxide layer 13 is varied to control the relative operation of the two stacked N-channel transistors 10 and 12.

The upper N-channel MOSFET 12 is formed by depositing a blanket layer of P type doped polysilicon (not shown) overlying the second gate oxide layer 42. The P type doped polysilicon is doped using a technique selected from among several suitable techniques including doping in situ during deposition and doping subsequent to deposition by implant or diffusion. A photoresist mask (not shown) is formed to protect a region overlying the common gate 40 and the polysilicon gate 14 of the lower N-channel MOSFET 10 and a source region 54 and a drain region 52 for the upper N-channel MOSFET 12 are implanted with a heavily-dope N+ type implant. The blanket layer of P type doped polysilicon is patterned and etched so that the entire polysilicon layer is removed except for a region of the upper N-channel MOSFET 12 including only the drain region 52, the source region 54, and a channel region 56 between the drain region 52 and source region 54 and directly overlying the common gate 40. The upper N-channel MOSFET 12 is isolated by a second ILD layer of silicon dioxide 58 that is deposited overlying the second gate oxide layer 42 and the upper N-channel MOSFET 12.

The upper and lower N-channel MOSFETs 10 and 12 and the common gate 40 may be directly aligned in some embodiments or may be offset by some amount so long as activation of the gate switches both MOSFETs 10 and 12.

Figure 1B:
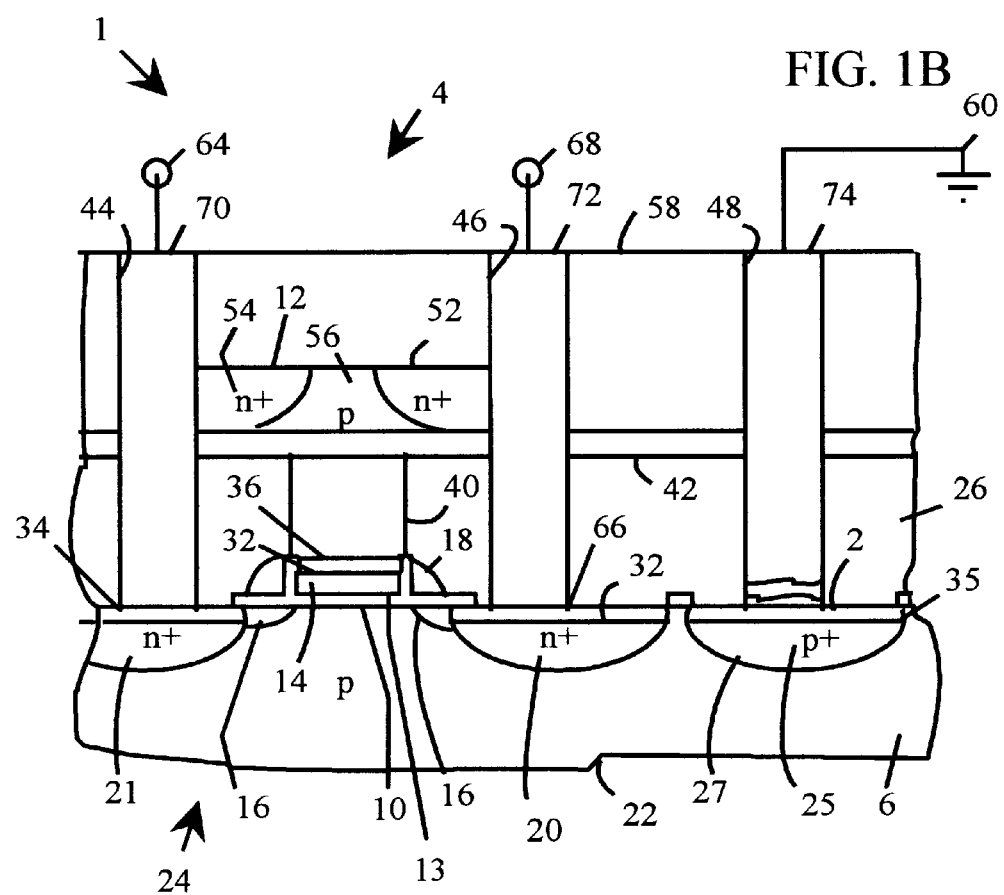

Referring to FIG. 1B, the high-density pass-gate 4 with the two stacked N-channel transistors 10 and 12 interconnected at sources 24 and 54 and interconnected at drains 22 and 52. In the illustrative embodiment, the sources 24 and 54 are interconnected by a source metal plug 44 and the drains 22 and 52 are interconnected by a drain metal plug 46. A ground metal plug 48 passes through the ILD layer of silicon dioxide 26 and the second ILD layer of silicon dioxide 58 to form a connection between the ground well 25 and an external ground terminal 60. The source metal plug 44 forms an electrical contact with the source silicide layer 34 of the source region 24 and with a lateral surface 62 of the source region 24. The source metal plug 44 is connected to an input terminal 64 of the semiconductor wafer 1. The drain metal plug 46 forms an electrical contact with the drain silicide layer 32 of the drain region 22 and with a lateral surface 66 of the drain region 22. The drain metal plug 46 is connected to an output terminal 68 of the semiconductor wafer 1.

A gate metal plug for connecting the common gate 40 to a control input terminal and a top N-channel MOS substrate for connecting to ground are not shown in the cross-sectional views of FIGS. 1A and 1B since the gate metal plug and the N-channel MOS substrate are formed in a third dimension (into the page) of the current view.

The metal plugs are formed by performing a contact etch operation to the top surface of the semiconductor wafer 1 in the region overlying the source region 24 of the lower N-channel MOSFET 10, the region overlying the drain region 22 of the lower N-channel MOSFET 10, and the region overlying the ground well 25. A source via 70 is etched through the second ILD layer of silicon dioxide 58, the second gate oxide layer 42, and the ILD layer of silicon dioxide 26 to the surface 2 of the substrate 6 at the location of the source silicide layer 34 in the source region 24. The source via 70 is etched through the second ILD layer of silicon dioxide 58 intersecting or adjacent to the source region 54 of the upper N-channel MOSFET 12. A drain via 72 is etched is etched through the second ILD layer of silicon dioxide 58, the second gate oxide layer 42, and the ILD layer of silicon dioxide 26 to the surface 2 of the substrate 6 at the location of the drain silicide layer 32 in the drain region 22. The drain via 72 is etched through the second ILD layer of silicon dioxide 58 intersecting or adjacent to the drain region 52 of the upper N-channel MOSFET 12. A ground via 74 is etched through the second ILD layer of silicon dioxide 58, the second gate oxide layer 42, and the ILD layer of silicon dioxide 26 to the surface 2 of the substrate 6 at the location of the ground silicide layer 35 in the ground well 25.

The source via 70, the drain via 72, and the ground via 74 are filled by deposition of a metal such as tungsten (W), titanium (Ti), tantalum (Ta), molybdenum (Mo), or another suitable metal or metal silicide to form, respectively, the source metal plug 44, drain metal plug 46, and ground metal plug 48. The metal plugs and the upper surface of the second ILD layer of silicon dioxide 58 are planarized by chemical-mechanical polishing (CMP).

The pass-gate 4 is a doubled device that advantageously occupies half the area that would be used by a conventional single-level device, while the drive current delivered by the pass-gate 4 is equal to the current delivered by the conventional device.

Figure 2A:
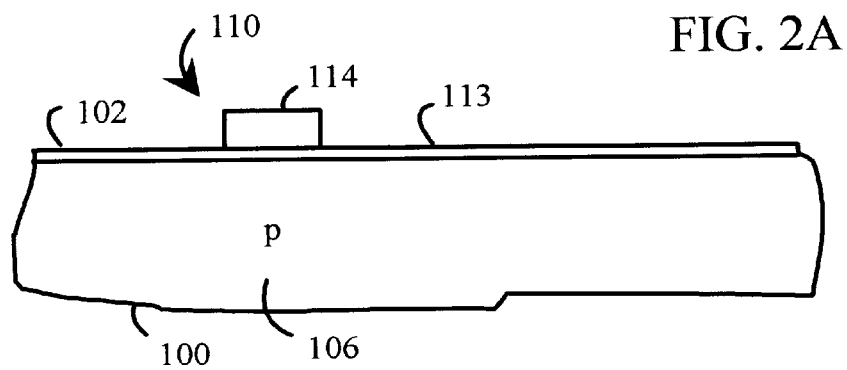
FIGS. 2A through 2M depict a sequence of schematic cross-sectional views of a portion of a silicon wafer during processing for forming an integrated circuit including a high-density pass-gate including two stacked N-channel transistors and which share a common gate electrode.

Referring to FIGS. 2A through 2M, a series of schematic cross-sectional views of a silicon wafer 100 illustrate a more detailed view of a fabrication sequence for forming an integrated circuit including a high-density pass-gate 108 including two stacked N-channel transistors 110 and 112 which share a common gate electrode 140. Referring to FIG. 2A, an exemplary embodiment is shown in which an N-channel MOS (NMOS) device in an N-well technology is formed in a lightly-doped P-substrate 106 having a P-type impurity concentration of greater than approximately $10^{15}/cm^3$. The starting material is typically a heavily-doped <100>-orientation silicon substrate wafer 100 having a quality suitable for integrated circuit manufacture.

Formation of transistors in a plurality of substrate layers substantially increases the density of an integrated circuit without appreciably increasing the thickness of the silicon substrate wafer 100. The thickness of the silicon substrate wafer 100 is selected to be sufficient to withstand multiple diffusion processes without warping. For example, a typical eight inch silicon wafer 100 has a thickness of approximately 720 or 721 microns which is increased by epitaxial growth of a P+ substrate grown directly upon the silicon wafer 100, and further increases by epitaxial growth of a P– substrate overlying the P+ substrate. The P– epitaxial growth is generally included for implementing functions such as latchup protection. Additional substrate is grown to a thickness generally in the range from 1 to 8 microns to form additional layers of transistors. For example, in the illustrative embodiment, an intralayer dielectric is deposited to a thickness in a range from approximately 10000Å to 25000Å with a substrate formed within the intralayer dielectric formed to a thickness in the range from approximately 500Å to 4000Å.

A thin (5μm to 10μm) lightly-doped epitaxial layer is grown on the silicon substrate wafer 100. The illustrative epitaxial layer is a P-type epitaxial surface layer with a <100>orientation and a resistivity of 12 ohm-cm. Either an n-epi-on-n$^+$ or a p-epi-on-p$^+$ substrate may be used for the epitaxial layer. The p-epi-on-p+ substrate is more typically used due to a lesser sensitivity to process-induced defects. The silicon substrate and the epitaxial layer in combination form a lightly-doped P-substrate 106 at a processing surface of the silicon substrate wafer 100.

Ions are implanted into the lightly-doped P-substrate 106 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants and punchthrough implants are implanted prior to growth of a first gate oxide layer 113 on a surface 102 of the silicon substrate wafer 100. In various embodiments, threshold adjustment implants and punchthrough implants may be performed either before or after formation of a trench or before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/cm$^2$ and an energy in the range from about 10 keV to 100 keV, an energy insufficient to penetrate a trench or field oxide isolation (not shown). The $V_T$ adjustment implant for enhancementmode devices is typically performed without masking.

A threshold voltage $V_T$ adjustment implant for depletion-mode devices is performed by implanting areas of depletion-mode devices with phosphorus or arsenic atoms at a concentration of about $10^{12}$ atoms/cm$^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

A layer of silicon dioxide with a thickness in the range of 30Å to 150Å forms a first gate oxide layer 113 on the top surface 102 of the silicon substrate wafer 100 by tube growth at a temperature of 700° C. to 1000° C. in an $O_2$ ambient. In an illustrative embodiment, a polysilicon gate 114 for a lower N-channel MOSFET 110 is formed by depositing a layer of undoped polysilicon to a thickness of approximately 2000Å by low pressure chemical vapor deposition (LPCVD) over the first gate oxide layer 113. In various embodiments, the polysilicon gate 114 is doped using a technique selected from among several suitable techniques including doping in situ during deposition and doping prior to etching by implanting arsenic atoms with a dosage in a range from $1\times10^{15}$ to $5\times10^{16}$ atoms/cm$^2$ and an energy in a range from 2 to 50 kiloelectron-volts (keV). In another example, polysilicon gate 114 is doped in a subsequent process step during introduction of dopant into the silicon substrate wafer 100. The polysilicon gate 114 is formed by depositing a photoresist mask (not shown) in a continuous layer over the polysilicon layer and irradiating the photoresist mask using a photolithographic system. The photolithographic system projects I-line ultraviolet light from a mercury-vapor lamp through a reticle and a focusing lens to form a predetermined image pattern on the photoresist mask. The photoresist mask is developed and irradiated portions are removed to form openings in the mask. An anisotropic dry etch etches the polysilicon layer to form the polysilicon gate 114 with substantially vertical side walls using an etching process that is highly selective of polysilicon. A reactive ion etch (RIE) removes the regions of first gate oxide layer 113 except for portions underlying the polysilicon gate 114. The photoresist mask is stripped. The polysilicon gate 114 of the lower N-channel MOSFET 110 overlies a region of the lightly-doped P-substrate 106.

Figure 2B:
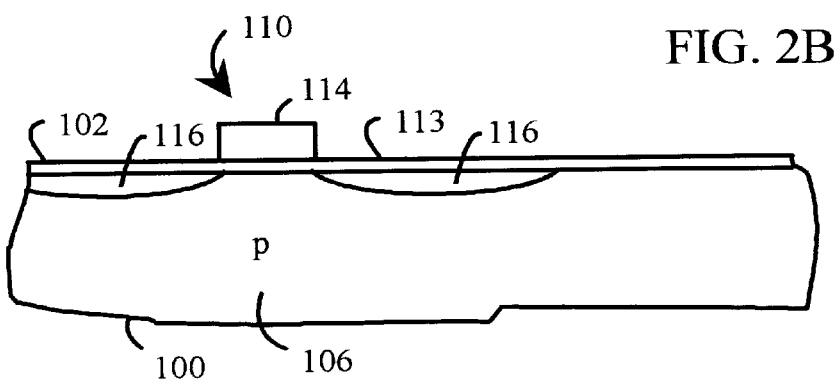

Referring to FIG. 2B, a first masking step and a first ion implant step form a N$^-$ LDD implant and include applying a lightly-doped drain (LDD) mask to the silicon substrate wafer 100 and implanting N$^-$ ions to form N-channel transistor LDD regions 116 which are self-aligned with the polysilicon gate 114. The N$^-$ ion implantation process includes implanting arsenic at a dosage in the range of $1\times10^{13}$ to $5\times10^{14}$ atoms/cm$^2$ and an energy in the range of 2 to 50 keV, using the polysilicon gate 114 as an implant mask.

Figure 2C:
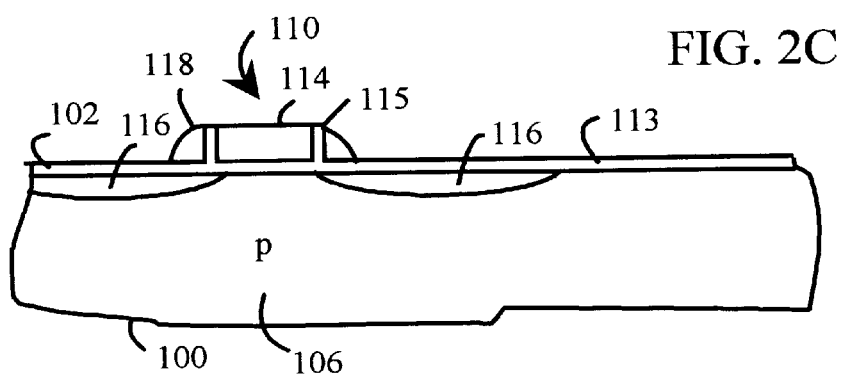

Referring to FIG. 2C, silicon dioxide spacers 118 are formed on substantially vertical side walls of the lower N-channel MOSFET 110. In the illustrative embodiment, the silicon dioxide spacers 118 are formed separated from the polysilicon gate 114 by a thin oxide layer 115 and separated from the lightly-doped P-substrate 106 by the first gate oxide layer 113. In an alternative embodiment, the silicon dioxide spacers 118 may be formed directly in contact with the polysilicon gate 114 and directly in contact with the lightly-doped P-substrate 106. The configuration of the N-channel transistor LDD regions 116 determines the hot carrier performance of the transistors and is established by the profile of the spacers 118.

Figure 2D:
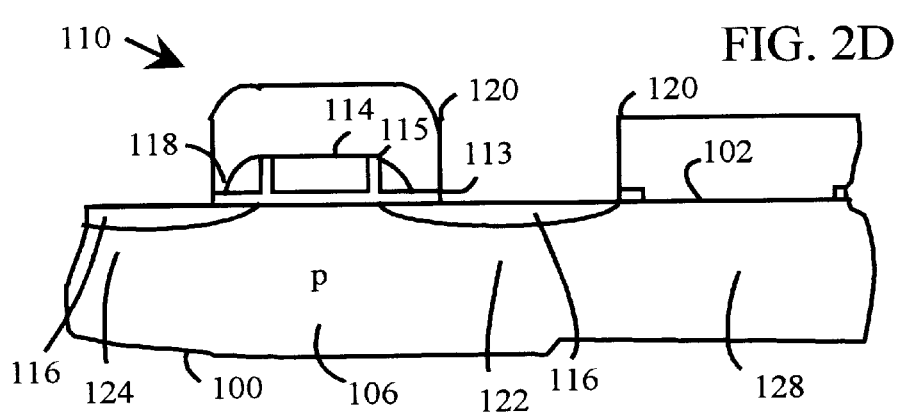

Referring to FIG. 2D, a photoresist mask 120 is formed overlying the first gate oxide layer 113, the polysilicon gate 114, and the silicon dioxide spacers 118 for patterning and etching the first gate oxide layer 113 to strip the first gate oxide layer 113 in various regions including a source region 124, a drain region 122, and a ground well region 128. The first gate oxide layer 113 is removed and the lightly-doped P-substrate 106 is exposed in these regions.

Figure 2E:
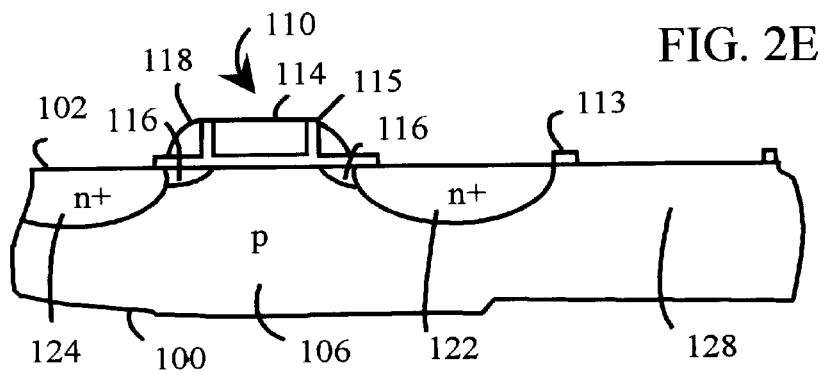

Referring to FIG. 2E, heavily-doped N+ source-drain regions are formed for the lower N-channel MOSFET 110 in the drain region 122 and the source region 124 by implanting N+ type ions into the lightly-doped P-substrate 106. The heavily-doped drain region 122 and the heavily-doped source region 124 are implanted by injecting arsenic atoms into a portion of the surface of the silicon substrate wafer 100 that is self-aligned with the polysilicon gate 114 and the silicon dioxide spacers 118 on the drain side and the source side of the lower N-channel MOSFET 110, respectively. The arsenic atoms are implanted at a dosage in the range of $1\times10^{15}$ to $5\times10^{15}$ atoms/cm$^2$ and an energy in the range of 2 to 50 keV to produce an arsenic concentration in the range of about $1\times10^{18}$ to $1\times10^{19}$ atoms/cm$^3$ and a junction depth in the range of 200Å to 3000Å.

The junction depth of the N-channel drain region 122 and the N-channel source region 124 is deeper than the depth of N-channel transistor LDD regions 116. The dopant concentration of the N-channel drain region 122 is sufficiently large to attain a conductive state of the lower N-channel MOSFET 110 when connected to a suitably doped source.

The silicon substrate wafer 100 is annealed to remove crystalline damage and activate and drive-in the implanted arsenic using a rapid thermal anneal process at a temperature in a range from 950° C. to 1050° C. for 10 to 60 seconds. The implanted arsenic in the silicon substrate wafer 100 diffuses laterally and vertically to merge the N-channel drain region 122 with the N-channel transistor LDD regions 116 in the vicinity of the N-channel drain region 122 and to merge the N-channel source region 124 with the N-channel LDD regions 116 in the vicinity of the N-channel source region 124.

Figure 2F:
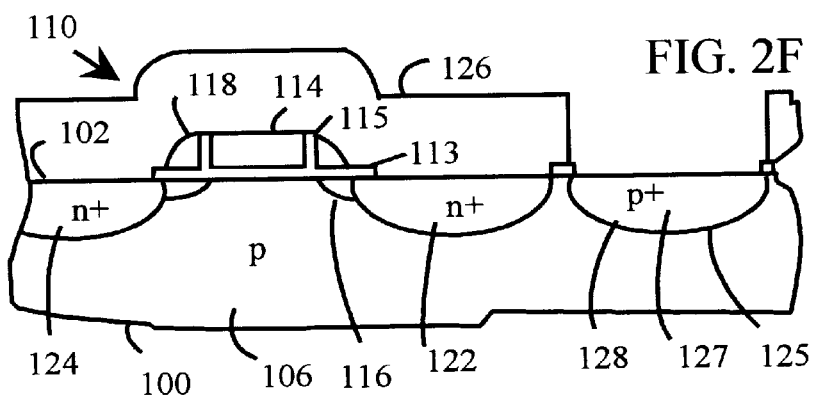

Referring to FIG. 2F, a photoresist mask 126 is formed and patterned overlying the surface 102 of the lightly-doped P-substrate 106 and overlying the polysilicon gate 114 and silicon dioxide spacers 118. Patterning of the photoresist mask 126 exposes the surface 102 of the lightly-doped P-substrate 106 in the ground well region 128. A heavily-doped P+ implant of the lightly-doped P-substrate 106 through the patterned mask forms a P+ type ground implant 127 in a ground well 125. The heavily-doped P+ type ground implant 127 in the ground well 125 is implanted by injecting boron atoms or $BF_2$ molecules into a portion of the surface of the lightly-doped P-substrate 106 that is exposed by the mask. The boron atoms or $BF_2$ molecules are implanted at a dosage in the range of $1\times10^{15}$ to $5\times10^{15}$ atoms/cm$^2$ and an energy in the range of 10 KeV to 80 KeV to produce a boron or $BF_2$ concentration in the range of about $1\times10^{18}$ to $1\times10^{20}$ atoms/cm$^3$ and a junction depth in the range of 200Å to 3000Å. Generally, a typical P+ ion implant process is a shallow implant and therefore utilizes an implantation of $BF_2$ ions rather than boron ions. Boron ions are very light ions and a very low energy must be used to provide a shallow boron ion implant. If too high an energy is used, the light ions are implanted at too great a depth. However, when the implanting energy is low, the beam current is also too low so that the time taken to perform the implant is excessive. $BF_2$ ions are larger and heavier ions so that a higher energy implant achieves a shallow depth.

Figure 2G:
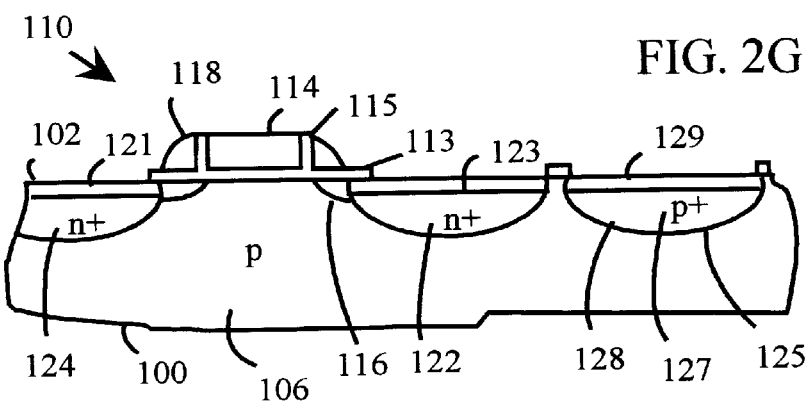

Referring to FIG. 2G, a metal silicide 121, 123, and 129 is respectively formed on the upper surface of the heavily-doped N+ source region 124 and drain region 122, the upper surface of the heavily-doped P+ ground well 125. At the same time, a metal silicide is formed on the upper surface of the polysilicon gate 114 and silicon dioxide spacers 118. The silicide is formed through an alloy step of depositing a refractory metal such as titanium (Ti), Tungsten (W), tantalum (Ta), or molybdenum (Mo) on the entire surface of the silicon substrate wafer 100, reacting the metal to form a silicide, and selectively removing the unreacted metal. In the salicide structure, silicide is formed both in the diffusion areas of the source region 124, the drain region 122, and the ground well 125 and on the polysilicon gate 114. The silicon dioxide spacers 118 separate the silicided region at the surface of the polysilicon gate 114 from the diffusion regions of the source 124 and the drain 122, typically a separation on the order of 400Å to 3000Å that may be bridged by the silicide formation. Bridging is prevented by annealing the silicon substrate wafer 100 in pure nitrogen $N_2$ or pure forming gas (90% $N_2$+10% $H_2$). To prevent the refractory metal from reacting with the silicon dioxide spacers 118, the reactance temperature is constrained to 700° C. or less. In some process embodiments, reactance of the refractory metal with the silicon dioxide spacers 118 is prevented using a two step process in which the temperature is maintained below about 650° C. in a first step. In a second step, unreacted metal is selectively etched and removed in a room temperature mixture of DI $H_2O$, $H_2O_2$, and $NH_4OH$ (5:1:1), and a temperature of about 850° C. is applied to lower the silicide sheet resistance and to stabilize the silicide phase.

In other process embodiments, rapid thermal processing (RTP) is used to effect the formation of silicide. In one embodiment, silicide ($TiSi_2$) is formed by rapid thermal processing at a temperature of 600° C. to 800° C. in argon. The unreacted metal is selectively removed and a stabilization anneal step is performed at approximately 1000° C. for 30 seconds in argon to reduce silicide resistance.

Figure 2H:
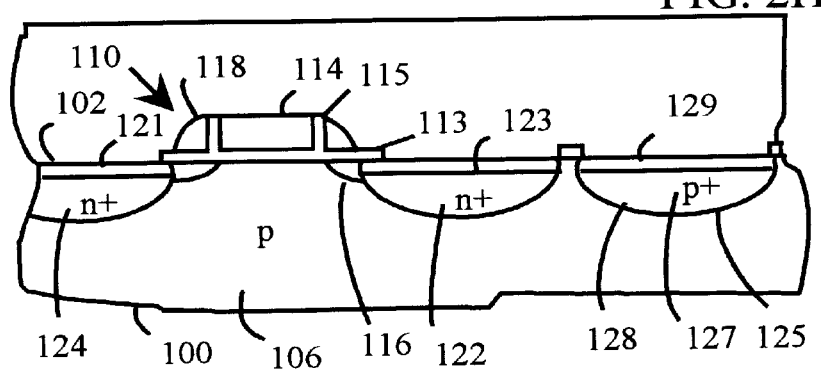

Referring to FIG. 2H, a blanket intralayer dielectric (ILD) layer of silicon dioxide ($SiO_2$) 130 is formed over the silicon substrate wafer 100, covering the polysilicon gate 114 and silicon dioxide spacers 118 of the lower N-channel MOSFET 110. The ILD oxide layer 130 has a thickness in the range of 1000Å to 25000Å and is conformally deposited over the silicon substrate wafer 100 by chemical vapor deposition (CVD) at a temperature in the range of 300° C. to 400° C. The thick ILD layer of silicon dioxide 130 is planarized, for example by chemical-mechanical polishing or by reflow. The ILD layer of silicon dioxide 130 mutually isolates devices including the lower N-channel MOSFET 110 on the surface of the silicon substrate wafer 100 and isolates devices from overlying conductive layers.

Figure 2I:
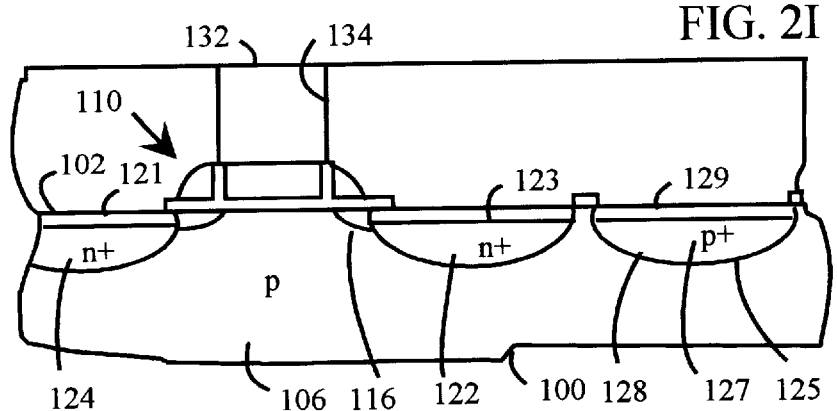

Referring to FIG. 2I, the thick ILD layer of silicon dioxide 130 is selectively etched to form a common gate via 132 directly overlying the polysilicon gate 114. The ILD layer of silicon dioxide 130 is patterned using photoresist to leave a region the size, shape, and position of the polysilicon gate 114 unprotected. The common gate via 132 is typically etched using hydrofluoric acid (HF) as a basic etchant. HF dissolves silicon dioxide ($SiO_2$) without attacking silicon. HF is applied generally as an assay of 49% HF in combination with ammonium fluoride and water to reduce the etch rate of the assay to a reasonably controllable rate. The common gate via 132 is filled with a gate electrode material, typically polysilicon but possibly other materials such as metals. In an illustrative embodiment, polysilicon is deposited into the common gate via 132 and overlying the surface of the ILD layer of silicon dioxide 130 and polished using a chemical-mechanical polishing operation to remove the polysilicon overlying the ILD layer of silicon dioxide 130 and leave the polysilicon only in the common gate via 132 to form a common gate 134. The polysilicon is deposited by low pressure chemical vapor deposition (LPCVD) on the top surface of the ILD layer of silicon dioxide 130 to a selected thickness generally in a range from approximately 500Å to 4000Å. The polysilicon is generally deposited by pyrolysis, thermal decomposition of silane ($SiH_4$), in a selected temperature range above 580° C. and typically in a range from approximately 580° C. to 650° C. The most typical technique for depositing polysilicon is LPCVD on the basis of the uniformity and purity of the deposited polysilicon and economy of the process. In one embodiment, polysilicon is deposited using an LPCVD system by a process in which 100% silane is applied at total pressures ranging from 0.3–1 torr. Other process embodiments are also viable. For example, 25% silane may be applied with a nitrogen carrier at total pressures from 0.3–1 torr. Another exemplary process utilizes a vertical flow isothermal reactor configuration, applying 25% silane diluted in hydrogen at approximately 1 torr pressure. The common gate 134 may be doped in the manner described previously for doping the polysilicon gate 114. The common gate 134 is typically deposited from polysilicon but in some embodiments may be a metal such as titanium, aluminum or other metals that withstand elevated processing temperatures such as cobalt-based and titanium-based alloys.

In the illustrative embodiment, the common gate 134 is symmetric, in that the width of the common gate 134 is the same adjacent to the lower N-channel MOSFET 110 and the upper N-channel MOSFET 112. The symmetric common gate 134 causes the lower N-channel MOSFET 110 and the upper N-channel MOSFET 112 to have similar performance which is useful for a pass-gate transistor. In other transistor configurations, the common gate 134 may be designed with an asymmetric structure with a wider surface presented to one of the transistors. Similarly, an asymmetric gate may be employed that is connected to one transistor at one level and multiple transistors on the opposite level.

Figure 2J:
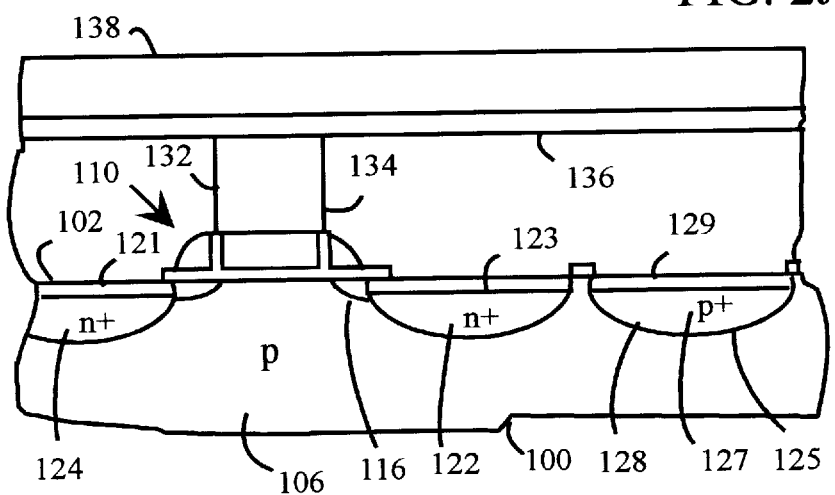

Referring to FIG. 2J, a layer of silicon dioxide with a thickness in the range of 30Å to 500Å forms a second gate oxide layer 136 overlying the ILD layer of silicon dioxide 130 and the common gate 134 by tube growth at a temperature of 700° C. to 1000° C. in an $O_2$ ambient. The thickness of the second gate oxide layer 136 is controlled to select performance characteristics of the high-density pass-gate 108. An upper transistor layer of polysilicon 138 is deposited overlying the second gate oxide layer 136 for forming the upper N-channel MOSFET 112. In an illustrative embodiment, the upper transistor layer of polysilicon 138 is formed by depositing a layer of undoped polysilicon to a thickness of approximately 2000Å by low pressure chemical vapor deposition (LPCVD) over the second gate oxide layer 136. The upper transistor layer of polysilicon 138 is doped to a P type conductivity in various embodiments using a technique selected from among several suitable techniques including doping in situ during deposition and doping prior to etching by implanting boron atoms or $BF_2$ molecules with a dosage in a range from $1\times10^{13}$ to $5\times10^{14}$ atoms/cm$^2$ and an energy in a range from 2 to 50 kiloelectron-volts (keV) to form a lightly doped P-substrate having a P-type impurity concentration of greater than approximately $10^{15}/cm^3$. The implant energy for a boron implant is typically much lower than the implant energy for the $BF_2$ since boron atoms are very light and implant too deeply at high energies.

The thicknesses of the gate oxide layer 130 and the second gate oxide layer 136 are controlled so that the P type region in the channel of the lower N-channel MOSFET 110 and the upper N-channel MOSFET 112 are sufficiently close to the common gate 134 to invert the channel, reversing the carriers in the MOSFETs.

Figure 2K:
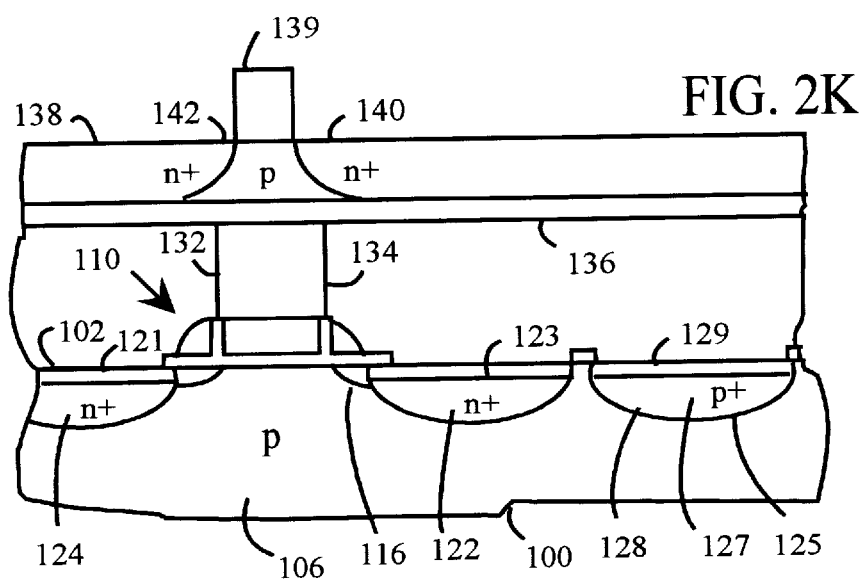

Referring to FIG. 2K, a layer of photoresist 139 is deposited overlying the upper transistor layer of polysilicon 138 and patterned to protect an area directly overlying the common gate 134 corresponding to a P type channel region of the upper N-channel MOSFET 112. Heavily-doped N+ source-drain regions are formed for the upper N-channel MOSFET 112 in a drain region 140 and the source region 142 by implanting N+ type ions into the lightly-doped upper transistor layer of polysilicon 138. The heavily-doped drain region 140 and the heavily-doped source region 142 are implanted by injecting arsenic atoms into a portion of the surface of the upper transistor layer of polysilicon 138 that is not protected by the photoresist 139 on the drain side and the source side of the upper N-channel MOSFET 112, respectively. The arsenic atoms are implanted at a dosage in the range of $1\times10^{15}$ to $5\times10^{15}$ atoms/cm$^2$ and an energy in the range of 2 to 50 keV to produce an arsenic concentration in the range of about $1\times10^{18}$ to $1\times10^{20}$ atoms/cm$^3$ and a junction depth in the range of 200Å to 3000Å but generally extending completely through the upper transistor layer of polysilicon 138.

The concentration of the N+ type doping of the source and drain regions of the upper N-channel MOSFET 112 is naturally reduced distal to the top surface of the polysilicon, advantageously producing a natural lightly-doped drain effect within the channel.

Figure 2L:
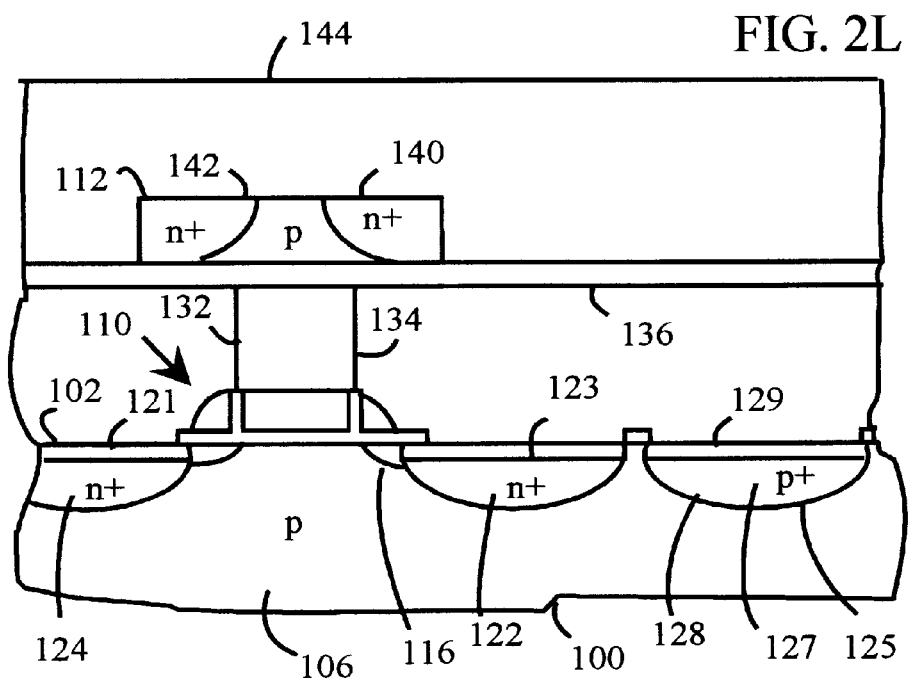

Referring to FIG. 2L, the upper N-channel MOSFET 112 is formed by depositing a photoresist mask (not shown) in a continuous layer over the upper transistor layer of polysilicon 138 and irradiating the photoresist mask using a photolithographic system. The photoresist mask is developed and irradiated portions are removed to form openings in the mask. An anisotropic dry etch etches the upper transistor layer of polysilicon 138 to form the upper N-channel MOSFET 112 with substantially vertical side walls using a reactive ion etch (RIE) process that is highly selective of polysilicon. The photoresist mask is stripped. A P type channel region of the upper N-channel MOSFET 112 directly overlies the common gate 134 and is flanked by the heavily-doped P+ drain region 140 on the side of the upper N-channel MOSFET 112 overlying the drain region 122 of the lower N-channel MOSFET 110 and the heavily-doped P+ source region 142 on the side of the upper N-channel MOSFET 112 overlying the source region 124 of the lower N-channel MOSFET 110.

A second blanket intralayer dielectric (ILD) layer of silicon dioxide (SiO$_2$) 144 is formed over the second gate oxide layer 136 and the upper N-channel MOSFET 112. The second ILD oxide layer 144 has a thickness in the range of 1000Å to 25000Å and is conformally deposited by chemical vapor deposition (CVD) at a temperature in the range of 300° C. to 400° C. The second thick ILD layer of silicon dioxide 144 is planarized, for example by chemical-mechanical polishing or by reflow. The second ILD layer of silicon dioxide 144 mutually isolates devices overlying the second gate oxide layer 136 including the upper N-channel MOSFET 112 and isolates devices from underlying conductive layers.

Figure 2M:
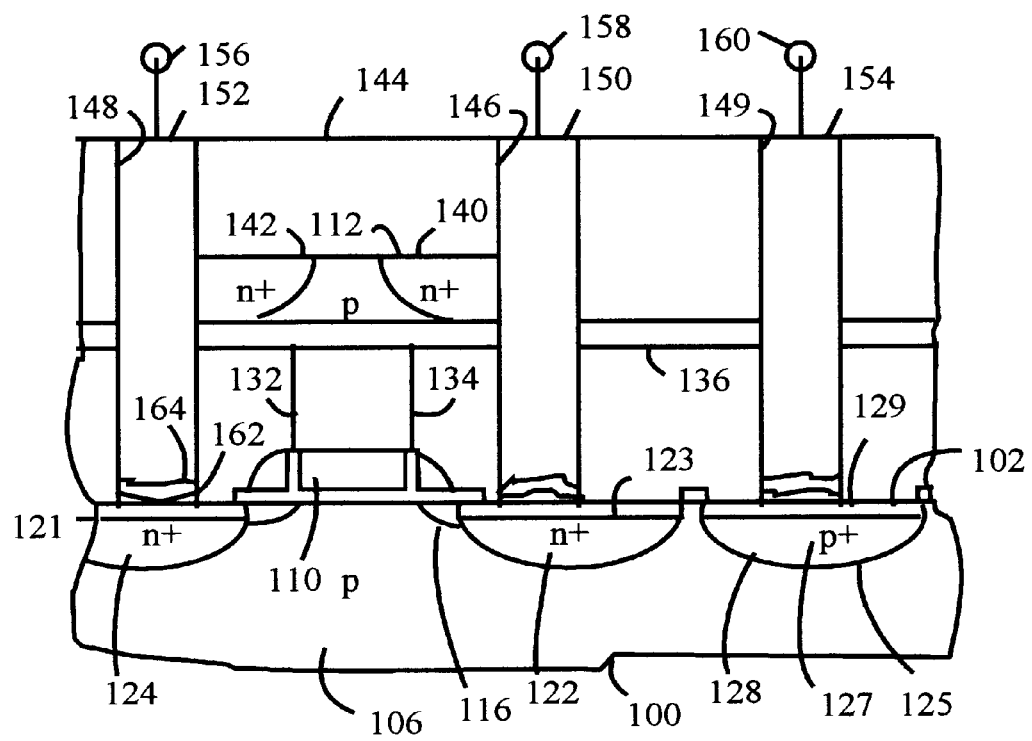

Referring to FIG. 2M, an interconnect layer contact mask is deposited in a continuous layer on the second ILD layer of silicon dioxide 144 and is irradiated using a photolithographic system to form a predefined two-dimensional image pattern on the outermost horizontal planar surface overlying the silicon substrate wafer 100. The interconnect layer contact mask defines a plurality of contact vias 146, 148, and 149 for accessing the surface of the silicon substrate wafer 100 adjacent to the drain region 140 and the source region 142 of the upper N-channel MOSFET 112 through the second ILD layer of silicon dioxide 144. The interconnect layer contact mask is developed and irradiated portions of the mask are removed to expose the second ILD layer of silicon dioxide 144 overlying the prospective locations of the contact vias 146, 148, and 149. The second ILD layer of silicon dioxide 144 is etched using a reactive ion etch (RIE) that etches the contact vias 146, 148, and 149 through the second ILD layer of silicon dioxide 144, the second gate oxide layer 136, and the gate oxide layer 130 to the surface of the silicon substrate wafer 100. A interconnect layer contact mask is patterned and etched to form vias that supply direct access to source and drain regions of the two stacked N-channel transistors 110 and 112 transistors.

The illustrative example shows a drain contact via 146 adjacent to and intersecting the drain region 140 of the upper N-channel MOSFET 112 and extending to the silicide at the drain region 122 of the lower N-channel MOSFET 110 on the surface 102 of the silicon substrate wafer 100. A source contact via 148 adjacent to and intersecting the source region 142 of the upper N-channel MOSFET 112 extends to the silicide at the source region 124 of the lower N-channel MOSFET 110. A ground contact via 149 is etched which extends to the silicide at the ground well 125. Following formation of the contact vias 146, 148, and 149, the interconnect layer contact mask is stripped.

In some embodiments, silicidation is performed on the etched portions of the source region 142 and the drain region 140 of the upper N-channel MOSFET 112 so that a strong silicide is formed not only on the source region 124 and the drain region 122 of the lower N-channel MOSFET 110, but also at the intersection of the source region 142 and the drain region 140 of the upper N-channel MOSFET 112.

A source metal plug 150, a drain metal plug 152 and a ground metal plug 154 are formed to interconnect the high-density pass-gate 108 and supply a ground connection. The source metal plug 150 connects the source region 124 of the lower N-channel MOSFET 110 and the source region 142 of the upper N-channel MOSFET 112, and is further connected to an input terminal 156. The drain metal plug 152 connects the drain region 122 of the lower N-channel MOSFET 110 and the drain region 140 of the upper N-channel MOSFET 112, and is further connected to an output terminal 158. The ground metal plug 154 connects a ground terminal 160 to the ground well 125. A layer of metal is deposited overlying the entire surface of the silicon substrate wafer 100 to form a local interconnect of metal plugs. The metal plugs 150, 152, and 154 are filled into the contact vias 146, 148, and 149 to form source, drain, and ground connections of the high-density pass-gate 108.

In some embodiments, the metal plugs 150, 152, and 154 are formed by first depositing a titanium sacrificial barrier 162 into the contact vias 146, 148, and 149 in contact with the source/drain regions of the silicon substrate wafer 100. Titanium films are used as a diffusion barrier since titanium (Ti) is an oxygen-gettering material and oxide-reducing agent. Accordingly, titanium dissolves a native oxide layer on the silicon surface of the silicon substrate wafer 100 during annealing and adheres well to both silicon and oxide ($SiO_2$). In addition, titanium forms good ohmic contacts to heavily-doped silicon whether the doping is N-type doping or P-type doping.

The illustrative structure advantageously facilitates circuit arrangements in which the sources of two or more transistors are connected.

In the illustrative embodiment, the metal plugs 150, 152, and 154 form a tungsten (W) interconnect. The titanium sacrificial barrier 162 between the polysilicon of the source regions of the silicon substrate wafer 100 and the tungsten metal plugs 150, 152, and 154 functions as a sacrificial barrier through the reaction of titanium with tungsten to form a titanium-tungsten alloy. The titanium sacrificial barrier 162 is formed by depositing a very thin layer of titanium onto the silicon substrate wafer 100 including deposition into the contact vias 146, 148, and 149. The silicon substrate wafer 100 is annealed to react the titanium with the silicon in the undoped polysilicon, thereby forming $TiSi_2$. The titanium is deposited as a very thin layer to avoid absorption of dopants from the undoped polysilicon during formation of $TiSi_2$.

Following the formation of the titanium sacrificial barrier 162, a titanium nitride (TiN) passive barrier 164 is formed over the titanium sacrificial barrier 162. The TiN passive barrier 164 serves as a contact diff-usion barrier in silicon integrated circuits by operating as an impermeable barrier to silicon and by virtue of a high activation energy for the diffusion of other impurities. TiN has a high thermodynamic stability and a relatively low electrical resistivity of transition metal carbides, borides or nitrides. The TiN passive barrier 164 is formed using one of multiple techniques. For example, the TiN passive barrier 164 is formed by: (1) evaporating titanium in a nitrogen ($N_2$) ambient, (2) reactively sputtering the titanium in an argon (Ar)-nitrogen ($N_2$) mixture, (3) sputtering from a TiN target in an inert argon ambient, (4) sputter depositing titanium in an argon (Ar) ambient and converting the titanium to TiN is a separate plasma nitridation step, or (5) chemical vapor deposition (CVD).

The tungsten metal plugs 150, 152, and 154 are formed by chemical vapor deposition (CVD) of tungsten in a low pressure CVD reactor. Typically tungsten tetrafluoride $WF_6$ is used as a source gas for reduction by hydrogen or silicon in a two-step process. In a first step, the tungsten source is reduced by silicon to form a layer of tungsten approximately 100Å thick. In a second step, hydrogen $H_2$ reduction is performed to deposit additional tungsten only on the tungsten layer formed in the first step. The metal plugs 150, 152, and 154 are formed in the contact vias 146, 148, and 149 over the titanium sacrificial barrier 162 and the TiN passive barrier 164 by silicon reduction of tungsten tetrafluoride $WF_6$, leaving solid tungsten and silicon fluoride vapor.

Once the metal plugs 150, 152, and 154 are formed, excess metal is removed, typically either by metal polishing or etching. In some embodiments of a fabrication process, the metal layer is polished using a chemical-mechanical polishing technique to a level substantially even with the surface of the second ILD layer of silicon dioxide 144. In other embodiments, the metal local interconnect layer is etched to localize metal plugs and lines to selected areas and configurations.

The metal plugs 150, 152, and 154 may be formed of metals other than tungsten. Metal plugs are most commonly constructed from titanium (Ti), tungsten (W), titanium nitride (TiN), aluminum (Al), or other common metals. Tungsten advantageously tolerates high temperatures that occur during annealing.

Referring to FIG. 3, a computer system 300 includes an integrated circuit 302, a central processing unit 304, a memory 306, and an interface 308, connected to a modem 310. The computer system 300 also includes a keyboard 312 and a display 314 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

For example, although in the illustrative embodiment, source regions of the two N-channel MOS transistors are connected and drain regions of the two N-channel MOS transistors are connected to form a pass-gate structure, in other embodiments regions of the stacked transistors may be connected in a different manner to form a different stacked structure.

Furthermore, although the illustrative embodiment includes two N-channel MOS transistors, in other embodiments different types of transistors may be employed such as P-channel MOS transistors.

What is claimed is:

1. An integrated circuit chip including an integrated circuit formed using a method comprising:

forming a first transistor including a gate electrode on a substrate;

forming a patterned intralayer dielectric (ILD) layer overlying the substrate and the first transistor, the ILD layer being patterned to form an aperture over the gate electrode of the first transistor;

depositing a first-elevated-level polysilicon layer in the aperture of the ILD layer and directly coupled to an upper surface of the gate electrode of the first transistor; said first-elevated-level polysilicon layer having a planarized upper surface in relation to said ILD layer;

depositing an oxide isolation layer overlying the first-elevated-level polysilicon layer;

depositing a second-elevated-level polysilicon layer overlying the oxide isolation layer; and forming source, drain and channel regions of a second transistor in the second elevated level polysilicon layer directly overlying the first transistor, the first-elevated-level polysilicon layer coupling the first transistor and the second transistor and being a common gate of the first transistor and the second transistor.

2. An integrated circuit chip according to claim 1 formed using a method further comprising:

doping the substrate to form a source region, a drain region, and a channel region of the first transistor; and doping the second elevated level to form a source region, a drain region, and a channel region of the second transistor.

3. An integrated circuit chip according to claim 2 formed using a method further comprising:

doping the substrate and the second elevated level in a vicinity so that the source region or the second transistor generally overlies the source region of the first transistor, and the drain region of the second transistor generally overlies the drain region of the first transistor.

4. An integrated circuit chip according to claim 3 wherein the ILD layer is a first ILD layer, the integrated circuit chip being formed using a method further comprising:

forming a second intralayer dielectric (ILD) layer overlying the second transistor and overlying the oxide isolation layer.

5. An integrated circuit chip according to claim 4 formed using a method further comprising:

forming a source contact via extending through the second ILD layer, the oxide isolation layer, and the first ILD layer, the source contact via intersecting the source region of the first transistor and the source region of the second transistor;

forming a drain contact via extending through the second ILD layer, the oxide isolation layer, and the first ILD layer, the drain contact via intersecting the drain region of the first transistor and the drain region of the second transistor;

forming a source contact in the source contact via, the source contact being coupled to the source region of the first transistor and coupled to the source region of the second transistor; and forming a drain contact in the drain contact via, the drain contact being coupled to the drain region of the first transistor and coupled to the drain region of the second transistor.

6. An integrated circuit chip according to claim 5 wherein: the source contact is a metal plug and the drain contact is a metal plug.

7. An integrated circuit chip according to claim 5 wherein: the source contact is a tungsten metal plug and the drain contact is a tungsten metal plug.

8. An electronic system including a microprocessor, a memory, a system bus and an integrated circuit fabricated using a method comprising:

forming a first transistor including a gate electrode on a substrate;

forming a patterned intralayer dielectric (ILD) layer overlying the substrate and the first transistor, the ILD layer being patterned to form an aperture over the gate electrode of the first transistor;

depositing a first-elevated-level polysilicon layer in the aperture of the ILD layer and directly coupled to an upper surface the gate electrode of the first transistor; said first-elevated-level polysilicon layer having a planarized upper surface in relation to said ILD layer;

depositing an oxide isolation layer overlying the first-elevated-level polysilicon layer;

depositing a second-elevated-level polysilicon layer overlying the oxide isolation layer; and forming source, drain and channel regions a second transistor in the second elevated level polysilicon layer directly overlying the first transistor, the first-elevated-level polysilicon layer coupling the first transistor and the second transistor and being a common gate of the first transistor and the second transistor.

9. An integrated circuit chip according to claim 8 formed using a method further comprising:

doping the substrate to form a source region, a drain region, and a channel region of the first transistor; and doping the second elevated level to form a source region, a drain region, and a channel region of the second transistor.

10. An integrated circuit chip according to claim 9 formed using a method further comprising:

doping the substrate and the second elevated level in a vicinity so that the source region or the second transistor generally overlies the source region of the first transistor, and the drain region of the second transistor generally overlies the drain region of the first transistor.

11. An integrated circuit chip according to claim 10 wherein the ILD layer is a first ILD layer, the integrated circuit chip being formed using a method further comprising:

forming a second intralayer dielectric (ILD) layer overlying the second transistor and overlying the oxide isolation layer.

12. An integrated circuit chip according to claim 11 formed using a method further comprising:

forming a source contact via extending through the second ILD layer, the oxide isolation layer, and the first ILD layer, the source contact via intersecting the source region of the first transistor and the source region of the second transistor;

forming a drain contact via extending through the second ILD layer, the oxide isolation layer, and the first ILD layer, the drain contact via intersecting the drain region of the first transistor and the drain region of the second transistor;

forming a source contact in the source contact via, the source contact being coupled to the source region of the first transistor and coupled to the source region of the second transistor; and forming a drain contact in the drain contact via, the drain contact being coupled to the drain region of the first transistor and coupled to the drain region of the second transistor.

13. An integrated circuit chip according to claim 12 wherein: the source contact is a metal plug and the drain contact is a metal plug.

14. An integrated circuit chip according to claim 13 wherein: the source contact is a tungsten metal plug and the drain contact is a tungsten metal plug.

15. An integrated circuit comprising:

a substrate wafer;

a first transistor formed on the substrate wafer in a first transistor plane, the first transistor having a gate;

an intralayer dielectric (ILD) layer overlying the substrate and the first transistor, the ILD layer having an aperture over the gate of the first transistor;

a first-elevated-level polysilicon layer in the aperture of the ILD layer overlying and directly coupled to an upper surface of the gate of the first transistor, said first-elevated-level polysilicon layer having a planarized upper surface in relation to said ILD layer;

an oxide isolation layer overlying the first-elevated-level polysilicon layer and overlying the ILD layer, a second-elevated-level polysilicon layer overlying the oxide isolation layer; and a second transistor formed in the second elevated level polysilicon layer directly overlying the first transistor, the first-elevated-level polysilicon layer coupling the first transistor and the second transistor and being a common gate of the first transistor and the second transistor.

16. An integrated circuit according to claim 15 wherein the ILD layer is a first ILD layer, the integrated circuit further comprising:

a second intralayer dielectric (ILD) layer overlying the second transistor and overlying the oxide isolation layer.

17. An integrated circuit according to claim 16 further comprising:

a source contact via extending through the second ILD layer, the oxide isolation layer, and the first ILD layer, the source contact via intersecting a source region of the first transistor and a source region of the second transistor;

a drain contact via extending through the second ILD layer, the oxide isolation layer, and the first ILD layer, the drain contact via intersecting a drain region of the first transistor and a drain region of the second transistor;

a source contact in the source contact via, the source contact being coupled to the source region of the first transistor and coupled to the source region of the second transistor; and a drain contact in the drain contact via, the drain contact being coupled to the drain region of the first transistor and coupled to the drain region of the second transistor.

18. An integrated circuit according to claim 17 wherein: the source contact is a tungsten metal plug and the drain contact is a tungsten metal plug.

19. An integrated circuit according to claim 15, wherein the first transistor further comprises:

a gate oxide layer formed on the substrate;

a gate formed on the substrate overlying the gate oxide layer; and source and drain regions implanted into the substrate self-aligned with respect to the gate.

20. An integrated circuit according to claim 15, wherein the second transistor further comprises:

a gate oxide layer being the oxide isolation layer;

a gate being the common gate formed from the first elevated polysilicon layer; and source and drain regions implanted into the polysilicon layer and aligned with the gate.

21. An integrated circuit according to claim 15, wherein: the first-elevated-level polysilicon layer has a thickness of approximately 500Å to approximately 4000Å;

the oxide isolation layer has a thickness of approximately 500Å to approximately 2000Å; and the second-elevated-level polysilicon layer has a thickness of approximately 500Å to approximately 4000Å.

22. An integrated circuit according to claim 15, wherein: the first-elevated-level polysilicon layer has a thickness of approximately 500Å to approximately 4000Å;

the oxide isolation layer has a thickness of approximately 500Å to approximately 2000Å; and the second-elevated-level polysilicon layer has a thickness of approximately 300Å to approximately 500Å, the second-elevated-level polysilicon layer being doped throughout the thickness to the oxide isolation layer.

23. An integrated circuit comprising:

a substrate wafer;

a first transistor formed on the substrate wafer in a base transistor plane, the first transistor having a gate;

a base intralayer dielectric (ILD) layer overlying the first transistor and overlying the substrate wafer, the base ILD layer having an aperture over the gate of the first transistor;

a base polysilicon layer formed in the aperture in the base ILD layer, said base polysilicon layer having a planarized upper surface in relation to said ILD layer;and a plurality of elevated transistor planes, the elevated transistor planes including:

an oxide isolation layer overlying the base ILD layer and the base polysilicon layer;

an elevated level polysilicon layer overlying the oxide isolation layer;

source, drain and channel regions of an elevated level transistor formed on the elevated level polysilicon layer, the elevated-level transistor being formed in a vicinity generally overlying the base transistor;

an elevated level intralayer dielectric (ILD) layer overlying the elevated level transistor and overlying the oxide isolation layer, the elevated level ILD layer having an aperture over the gate of the elevated level transistor; and a gate polysilicon layer formed in the aperture in the elevated level ILD layer and being a common gate between adjacent elevated level transistors.

24. An integrated circuit according to claim 23, further comprising:

a source contact via extending through the elevated ILD layers, the oxide isolation layers, and the base ILD layer, the source contact via intersecting a source region of the base transistor and a source region of the elevated transistors;

a drain contact via extending through the elevated ILD layers, the oxide isolation layers, and the base ILD layer, the drain contact via intersecting a drain region of the base transistor and a drain region of the elevated transistors;

a source contact in the source contact via, the source contact being coupled to the source region of the base transistor and coupled to the source region of the elevated transistors; and a drain contact in the drain contact via, the drain contact being coupled to the drain region of the base transistor and coupled to the drain region of the elevated transistors.

25. An integrated circuit according to claim 24 wherein: the source contact is a tungsten metal plug and the drain contact is a tungsten metal plug.

26. An integrated circuit according to claim 23, wherein the base transistor further comprises:

a gate oxide layer formed on the substrate;

a gate formed on the substrate overlying the gate oxide layer; and source and drain regions implanted into the substrate self-aligned with respect to the gate.

27. An integrated circuit according to claim 23, wherein the elevated transistors further comprise:

source and drain regions implanted into the polysilicon layer with the gate.

28. An integrated circuit according to claim 23, wherein:

the gate polysilicon layer has a thickness of approximately 500Å to approximately 4000Å;

the oxide isolation layer has a thickness of approximately 500Å to approximately 2000Å; and the elevated level polysilicon layer has a thickness of approximately 500Å to approximately 4000Å.

29. An integrated circuit according to claim 23, wherein:

the gate polysilicon layer has a thickness of approximately 500Å to approximately 4000Å;

the oxide isolation layer has a thickness of approximately 500Å to approximately 2000Å; and the elevated level polysilicon layer has a thickness of approximately 300Å to approximately 500Å, the second-elevated-level polysilicon layer being doped throughout the thickness to the oxide isolation layer.

* * * * *